United States Patent
Iwamoto et al.

(10) Patent No.: US 12,099,263 B2
(45) Date of Patent: Sep. 24, 2024

(54) MAGNETO-OPTICAL MATERIAL AND PRODUCTION METHOD THEREFOR

(71) Applicant: RESEARCH INSTITUTE FOR ELECTROMAGNETIC MATERIALS, Tomiya (JP)

(72) Inventors: Satoshi Iwamoto, Tokyo (JP); Yasutomo Ota, Tokyo (JP); Kenji Ikeda, Tomiya (JP); Nobukiyo Kobayashi, Tomiya (JP)

(73) Assignee: Research Institute For Electromagnetic Materials, Miyagi (JP)

( * ) Notice: Subject to any disclaimer, the term of this patent is extended or adjusted under 35 U.S.C. 154(b) by 23 days.

(21) Appl. No.: 18/019,317

(22) PCT Filed: Jan. 12, 2022

(86) PCT No.: PCT/JP2022/000798
§ 371 (c)(1),
(2) Date: Feb. 2, 2023

(87) PCT Pub. No.: WO2022/154026
PCT Pub. Date: Jul. 21, 2022

(65) Prior Publication Data
US 2023/0273465 A1 Aug. 31, 2023

(30) Foreign Application Priority Data
Jan. 13, 2021 (JP) .................................. 2021-003325

(51) Int. Cl.
*G02F 1/00* (2006.01)
(52) U.S. Cl.
CPC .................................. *G02F 1/0036* (2013.01)

(58) Field of Classification Search
CPC ........ G02F 1/00; G02F 1/0036; G02F 1/0027; G02F 1/0081; G02F 1/09; G02F 1/093;
(Continued)

(56) References Cited

U.S. PATENT DOCUMENTS

| 2014/0090974 A1 | 4/2014 | Ballet et al. |
| 2018/0329114 A1 | 11/2018 | Anopchenko et al. |

(Continued)

FOREIGN PATENT DOCUMENTS

| JP | 2001-076329 A | 3/2001 |
| JP | 2002-277842 A | 9/2002 |

(Continued)

OTHER PUBLICATIONS

English translation of JP 2001076329. (Year: 2001).*

(Continued)

*Primary Examiner* — Jie Lei
(74) *Attorney, Agent, or Firm* — Carrier, Shende & Associates P.C.; Joseph P. Carrier; Fulchand P. Shende (57) ABSTRACT

Provided are a magneto-optical material capable of enhancing the tunable range of magneto-optical properties such as the Faraday rotation angle, and a method for producing the same. The temperature of a substrate 20 is controlled to a first temperature within the range of 300 to 800 [° C.], and the atmospheric pressure of the substrate 20 is controlled to $1.0 \times 10^{-4}$ [Pa] or less (first step). Using a composite target or plurality of individual targets of a TCO material exhibiting ENZ properties in the infrared wavelength region, together with a magnetic metal, a magneto-optical material 10 is deposited on the substrate 20 while the temperature of the substrate 20 is controlled to a second temperature within the range of 300 to 800 [° C.], and the atmospheric pressure of the substrate 20 is controlled to the range of 0.1 to 10 [Pa] (second step).

18 Claims, 9 Drawing Sheets

(58) Field of Classification Search
CPC .......... G02F 1/092; H01F 1/00; H01F 1/0063; H01F 41/18; H01F 10/14; H01F 10/16; H01F 10/18; C23C 14/08; C23C 14/34; C23C 14/086
USPC ..... 359/321, 324, 280, 282, 484.01, 484.02, 359/484.03, 484, 903
See application file for complete search history.

(56) References Cited

U.S. PATENT DOCUMENTS

| | | |
|---|---|---|
| 2018/0350922 A1 | 12/2018 | Sachet et al. |
| 2019/0309409 A1 | 10/2019 | Nghiem et al. |

FOREIGN PATENT DOCUMENTS

| | | |
|---|---|---|
| JP | 2004-309700 A | 11/2004 |
| JP | 2014-523390 A | 9/2014 |
| JP | 2017-098423 A | 6/2017 |
| JP | 2018-028499 A | 2/2018 |
| JP | 2019-518963 A | 7/2019 |
| JP | 2020-523621 A | 8/2020 |

OTHER PUBLICATIONS

Davoyan et al., "Theory of Wave Propagation in Magnetized Near-Zero-Epsilon Metamaterials: Evidence for One-Way Photonic States and Magnetically Switched Transparency and Opacity". Physical Review Letters. Dec. 16, 2013, vol. 111, No. 257401, pp. 257401-1-257401-5. Cited in the PCT/ISA/210 of PCT/JP2022/000798.

Ikeda et al., "Magneto-optical effect in nanogranular films with epsilon near zero matrix"., Aug. 17, 2021, vol. 45, p. 169, 02pB-12. Cited in the PCT/ISA/210 of PCT/JP2022/000798.

\* cited by examiner

MAGNETO-OPTICAL MATERIAL AND PRODUCTION METHOD THEREFOR

TECHNICAL FIELD

The present invention relates to a magneto-optical material and a production method therefor.

BACKGROUND ART

In order to increase the Faraday rotation angle of a layer having a magneto-optic effect, it has been proposed to configure the layer by combining a transparent magnetic layer and a dielectric (refer to Patent Literature 1).

CITATION LIST

Patent Literature

Patent Literature 1: Japanese Patent Laid-Open No. 2002-277842

SUMMARY OF INVENTION

Technical Problem

In general, the Faraday rotation angle $\theta_F$ when an electromagnetic wave (light) with angular velocity $\omega$ passes through a sample with thickness d is represented by the relational expression (01) using the diagonal component $\varepsilon_{xx}$ and the non-diagonal component $\varepsilon_{xy}$ of the dielectric tensor of the sample. "c" is the speed of light.

$$\theta_F = (\omega d/2c)\varepsilon_{xy}/(\varepsilon_{xx})^{1/2} \qquad (01).$$

According to the prior art, the Faraday rotation angle $\theta_F$ is increased by decreasing the diagonal component $\varepsilon_{xx}$ of the dielectric tensor of the sample, but the non-diagonal component $\varepsilon_{xy}$ of the dielectric tensor of the sample is not taken into account, and thus there has been a limit to increasing the Faraday rotation angle $\theta_F$.

An object of the present invention is to provide a magneto-optical material capable of enhancing the tunable range of magneto-optical properties such as the Faraday rotation angle, and a method for producing the same.

Solution to Problem

The magneto-optical material according to the present invention has a nanogranular structure comprising a matrix formed of a transparent electrode material exhibiting ENZ (Epsilon Near Zero) properties in the infrared wavelength region and magnetic metal particles dispersed in the matrix.

The method for producing a magneto-optical material according to the present invention includes:
  a first step of not only controlling the temperature of a substrate to a first temperature within the range of 300 to 800 [° C.] but also controlling the atmospheric pressure of the substrate to $1.0 \times 10^{-4}$ [Pa] or less; and
  a second step of applying a composite target or plurality of individual targets of at least one of an element and a compound that form the basis of TCO (Transparent Conductive Oxide) materials (transparent conductive materials) exhibiting ENZ properties in the infrared wavelength region, together with a magnetic metal while not only controlling the temperature of the substrate to a second temperature within the range of 300 to 800 [° C.] but also controlling the atmospheric pressure of the substrate to the range of 0.1 to 10 [Pa] to deposit the magneto-optical material on the substrate.

Advantageous Effects of Invention

According to the magneto-optical material of the present invention, in a nanogranular structure in which nanoparticles are dispersed in a matrix, the tunable range of the diagonal component $\varepsilon_{xx}$ of the dielectric tensor is enhanced to decrease the component by using, as a matrix, an ENZ material whose dielectric constant is extremely close to zero in a specific wavelength range, and the tunable range of the non-diagonal component $\varepsilon_{xy}$ of the dielectric tensor is enhanced to increase the component by using a ferromagnetic metal for the nanoparticles, thereby allowing to further enhance the tunable range of the magneto-optical properties such as the Faraday rotation angle $\theta_F$. In addition to enhancing the tunable range for decreasing the diagonal component $\varepsilon_{xx}$ of the dielectric tensor, the tunable range for increasing the non-diagonal component $\varepsilon_{xy}$ of the dielectric tensor is enhanced, thereby allowing to further enhance the tunable range of the magneto-optical properties such as the Faraday rotation angle $\theta_F$ (refer to relational formula (01)).

DESCRIPTION OF EMBODIMENTS

First Embodiment

Figure 1:
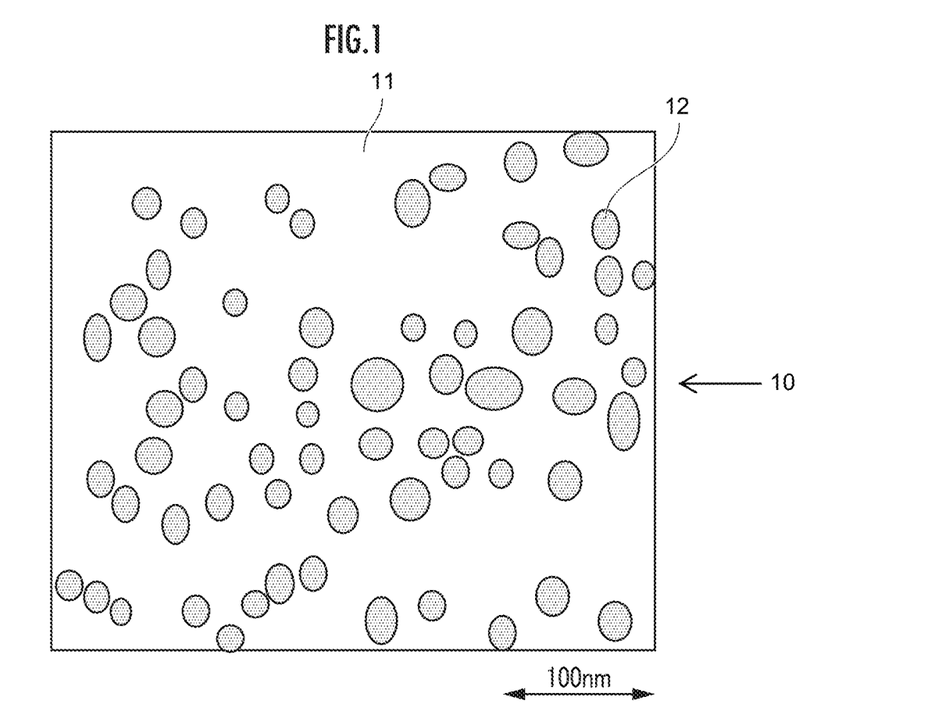
FIG. 1 shows a schematic illustrative view of the structure of a magneto-optical material according to the present invention.

In a magneto-optical material 10 as the first embodiment of the present invention, a matrix 11 is an $In_2O_3$-based compound, and magnetic metal particles 12 are particles of at least one metal selected from Fe, Co, and Ni or alloys thereof. As shown schematically in FIG. 1, the magneto-optical material 10 has a nanogranular structure composed of the matrix 11 formed of a TCO material exhibiting ENZ properties in the infrared wavelength region and the magnetic metal particles 12 dispersed in the matrix 11. The particle size of the magnetic metal particles 12 is, for example, within the range of 2 to 20 nm. This also applies to magneto-optical materials 10 in other embodiments.

The magneto-optical material 10 is represented by the composition formula $Fe_aCo_bNi_cIn_xO_yM_z$ with Sn as a M component, and the composition ratios a, b, c, x, y, and z satisfy, at atomic ratios, $0 \leq a \leq 0.35$, $0 \leq b \leq 9.35$, $0 \leq c \leq 0.35$, $0.05 \leq a+b+c \leq 0.50$, $0.20 \leq x \leq 0.40$, $0.40 \leq y \leq 0.60$, $0.01 \leq z \leq 0.20$, $0.50 \leq x+y+z \leq 0.95$, and $a+b+c+x+y+z=1$. One or more elements selected from Ge, Mo, F, Ti, Zr, Hf, Nb, Ta, W, and Te may be employed as the M component.

Second Embodiment

In the magneto-optical material 10 as the second embodiment of the present invention, the matrix 11 is a ZnO-based material, and the magnetic metal particles 12 are particles of at least one metal selected from Fe, Co, and Ni or alloys thereof. The magneto-optical material 10 is represented by the composition formula $Fe_aCo_bNi_cZn_xO_yM_z$ with the M component selected from Al and Ga, and the composition ratios a, b, c, x, y, and z satisfy, at atomic ratios, $0 \leq a \leq 0.35$, $0 \leq b \leq 0.35$, $0 \leq c \leq 0.35$, $0.05 \leq a+b+c \leq 0.50$, $0.20 \leq x \leq 0.50$, $0.20 \leq y \leq 0.50$, $0.01 \leq z \leq 0.10$, $0.50 \leq x+y+z \leq 0.95$, and $a+b+c+x+y+z=1$. One or more elements selected from B, In, Y, Sc, F, V, Si, Ge, Ti, Zr, and Hf may be employed as the M component.

Third Embodiment

In the magneto-optical material 10 as the third embodiment of the present invention, the matrix 11 is a CdO-based material, and the magnetic metal particles 12 are particles of at least one metal selected from Fe, Co, and Ni or alloys thereof. The magneto-optical material 10 is represented by the composition formula $Fe_aCo_bNi_cCd_xO_yM_z$ with the M component selected from In and Dy, and the composition ratios a, b, c, x, y, and z satisfy, at atomic ratios, $0 \leq a \leq 0.35$, $0 \leq b \leq 0.35$, $0 \leq c \leq 0.35$, $0.05 \leq a+b+c \leq 0.50$, $0.20 \leq x \leq 0.50$, $0.20 \leq y \leq 0.50$, $0.02 \leq z \leq 0.10$, $0.50 \leq x+y+z \leq 0.95$, and $a+b+c+x+y+z=1$. Sn may be employed as the M component.

Fourth Embodiment

In the magneto-optical material 10 as the fourth embodiment of the present invention, the matrix 11 is a $SnO_2$-based material, and the magnetic metal particles 12 are particles of at least one metal selected from Fe, Co, and Ni or alloys thereof. The magneto-optical material 10 is represented by the composition formula $Fe_aCo_bNi_cSn_xO_yM_z$ with the M component selected from F and Nb, and the composition ratios a, b, c, x, y, and z satisfy, at atomic ratios, $0 \leq a \leq 0.35$, $0 \leq b \leq 0.35$, $0 \leq c \leq 0.35$, $0.05 \leq a+b+c \leq 0.50$, $0.15 \leq x \leq 0.40$, $0.35 \leq y \leq 0.70$, $0.02 \leq z \leq 0.10$, $0.50 \leq x+y+z \leq 0.95$, and $a+b+c+x+y+z=1$.

Fifth Embodiment

In the magneto-optical material 10 as the fifth embodiment of the present invention, the matrix 11 is a $TiO_2$-based material, and the magnetic metal particles 12 are particles of at least one metal selected from Fe, Co, and Ni or alloys thereof. The magneto-optical material 10 is represented by the composition formula $Fe_aCo_bNi_cTi_xO_yNb_z$, and the composition ratios a, b, c, x, y, and z satisfy, at atomic ratios, $0 \leq a \leq 0.35$, $0 \leq b \leq 0.35$, $0 \leq c \leq 0.35$, $0.05 \leq a+b+c \leq 0.50$, $0.15 \leq x \leq 0.40$, $0.35 \leq y \leq 0.70$, $0.02 \leq z \leq 0.10$, $0.50 \leq x+y+z \leq 0.95$, and $a+b+c+x+y+z=1$.

Sixth Embodiment

In a magneto-optical material 10 as the sixth embodiment of the present invention, the matrix 11 is an $In_2O_3$—ZnO-based material and the magnetic metal particles 12 are particles of at least one metal selected from Fe, Co, and Ni or alloys thereof. The magneto-optical material 10 is represented by the composition formula $Fe_aCo_bNi_cIn_xGa_yZn_zO_w$, and the composition ratios a, b, c, x, y, z, and w satisfy, at atomic ratios, $0 \leq a \leq 0.35$, $0 \leq b \leq 0.35$, $0 \leq c \leq 0.35$, $0.05 \leq a+b+c \leq 0.50$, $0.15 \leq x \leq 0.40$, $0.35 \leq y \leq 0.70$, $0.02 \leq z \leq 0.10$, $0.65 \leq x+y+z \leq 0.95$, and $a+b+c+x+y+z+w=1$.

(Production Method)

The magneto-optical material 10 of the present invention is deposited on a substrate. As the substrate, a glass substrate such as quartz glass or #7059 manufactured by Corning Incorporated (trade name of Corning Incorporated), and a monocrystalline Si wafer or a MgO substrate having a surface thermally oxidized are employed.

Figure 2:
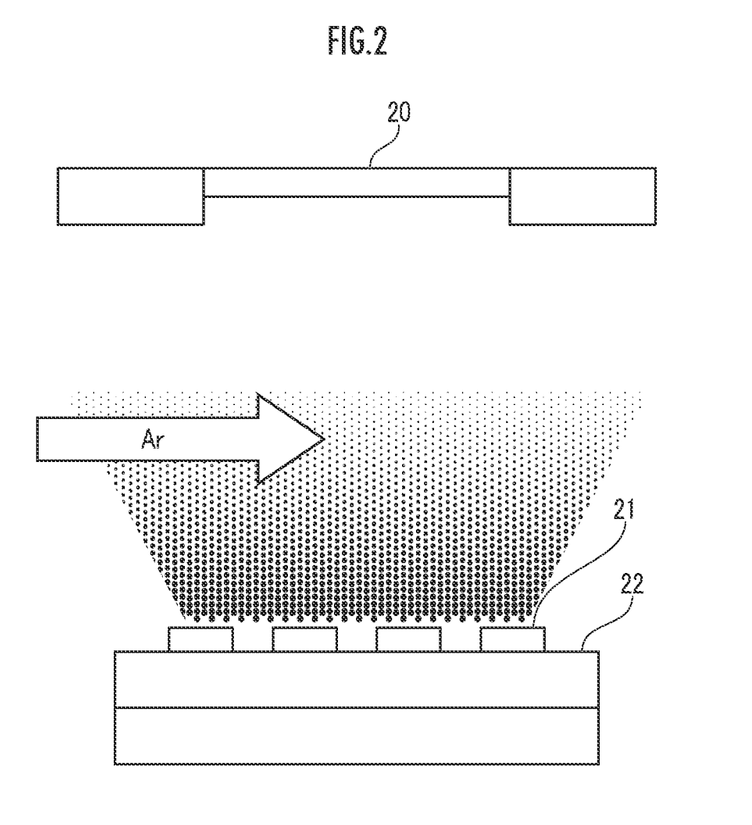
FIG. 2 shows a schematic illustrative view of the method for producing a magneto-optical material according to the present invention.

As shown in FIG. 2, for example, there is used the composite target obtained by arranging a chip 21 of a TCO material, such as ITO, AZO, GZO, or IGZO, which constitutes the matrix 11 and exhibits ENZ properties in the infrared wavelength region, on a disk 22 of magnetic metal including at least one of Fe, Co, and Ni, and the magneto-optical material 10 is deposited by a sputtering method. Instead of the chip 21 of the TCO material, a chip of an element constituting the TCO material or a compound of the element may be used. A chip of the same or corresponding oxide as or to a base material (for example, $In_2O_3$) or nitride (for example, GaN) and a chip of a dopant (for example, Sn and Ge) may be used. For the sixth embodiment, an $In_2O_3$ chip and a ZnO chip may be used as a base material chip.

Instead of the composite target, a magnetic metal target and a TCO material target, or targets of elements and/or compounds of the elements constituting the magnetic metal target and the TCO material may be used. In this case, the magneto-optical material 10 may be deposited by the sputtering method while adjusting factors such as the sputtering power of each target and the sputtering power supply time in order to adjust the composition ratio of the magneto-optical material 10.

Ar gas, a mixed gas of Ar and $N_2$, or a mixed gas of Ar and $O_2$ is used as the atmosphere gas for the sputtering deposition. The film thickness is controlled by the length of the deposition time, and the magneto-optical material 10 having a thickness of 0.3 to 3 [μm], for example, is produced. In the "first step" before deposition, the temperature of the substrate was controlled to a first temperature within the range of 300 to 800[° C.]. In addition, in order to suppress deterioration of the crystallinity of the matrix due to the influence of contamination of impurities and the accompanying deterioration of the transmittance, the atmospheric pressure of the substrate is controlled to $1.0 \times 10^{-4}$ [Pa] or less. In the "second step" as the deposition step, the temperature of the substrate was controlled to a second temperature within the range of 300 to 800[° C.]. In addition, the atmospheric pressure of the substrate was controlled to fall within the range of 0.1 to 10 [Pa]. The sputtering power during deposition was adjusted to 50 to 350 [W].

The first temperature may be equal to or lower than the second temperature, but the temperature of the substrate is preferably controlled in each of the first step and the second step so that the first temperature is higher than the second temperature.

EXAMPLES AND COMPARATIVE EXAMPLES

Thin films of Examples 1-1 to 1-5 and Comparative Examples 1-1 to 1-4 were formed on a substrate by sputtering. The number N-M of Examples and Comparative Examples represents the M-th example or the M-th comparative example of the N-th embodiment (N=1 to 7). As the substrate, a quartz substrate having a thickness of about 0.5 mm or a #7059 (trade name of Corning Incorporated) glass substrate manufactured by Corning Incorporated was used. Table 1 shows numerical values of atomic ratios a, b, c, x, y, and z representing the composition of the thin films of each of Examples and each of Comparative Examples. The composition of the thin film was adjusted by adjusting the composition of the composite target used during sputtering.

TABLE 1

|  | a | b | c | a + b + c | x | y | z | x + y + z | Deposition temperature [° C.] |
|---|---|---|---|---|---|---|---|---|---|
| Example 1-1 | 0.03 | 0.02 | 0 | 0.05 | 0.34 | 0.59 | 0.02 | 0.95 | 600 |
| Example 1-2 | 0.12 | 0.11 | 0 | 0.23 | 0.24 | 0.52 | 0.01 | 0.77 | 600 |
| Example 1-3 | 0.14 | 0.13 | 0 | 0.27 | 0.21 | 0.52 | 0.01 | 0.73 | 600 |
| Example 1-4 | 0 | 0 | 0.07 | 0.07 | 0.34 | 0.57 | 0.02 | 0.93 | 500 |
| Example 1-5 | 0 | 0 | 0.29 | 0.29 | 0.26 | 0.44 | 0.01 | 0.71 | 500 |
| Comparative Example 1-1 | 0.20 | 0.17 | 0 | 0.37 | 0.17 | 0.45 | 0.01 | 0.63 | 600 |
| Comparative Example 1-2 | 0.02 | 0.01 | 0 | 0.03 | 0.34 | 0.61 | 0.02 | 0.97 | 600 |
| Comparative Example 1-3 | 0 | 0 | 0.41 | 0.41 | 0.21 | 0.36 | 0.02 | 0.59 | 500 |
| Comparative Example 1-4 | 0 | 0 | 0.02 | 0.02 | 0.35 | 0.60 | 0.03 | 0.98 | 500 |

In preparing the magneto-optical materials 10 of Examples and Comparative Examples, the substrate temperature (first temperature) in the first step (before deposition) and the substrate temperature (second temperature) in the second step (during deposition) were controlled to be the same temperature. The temperature of the substrate was controlled by heating the substrate with a suitable heater. The atmospheric pressure of the substrate was controlled by evacuating the chamber containing the substrate with a vacuum pump.

Figure 3:
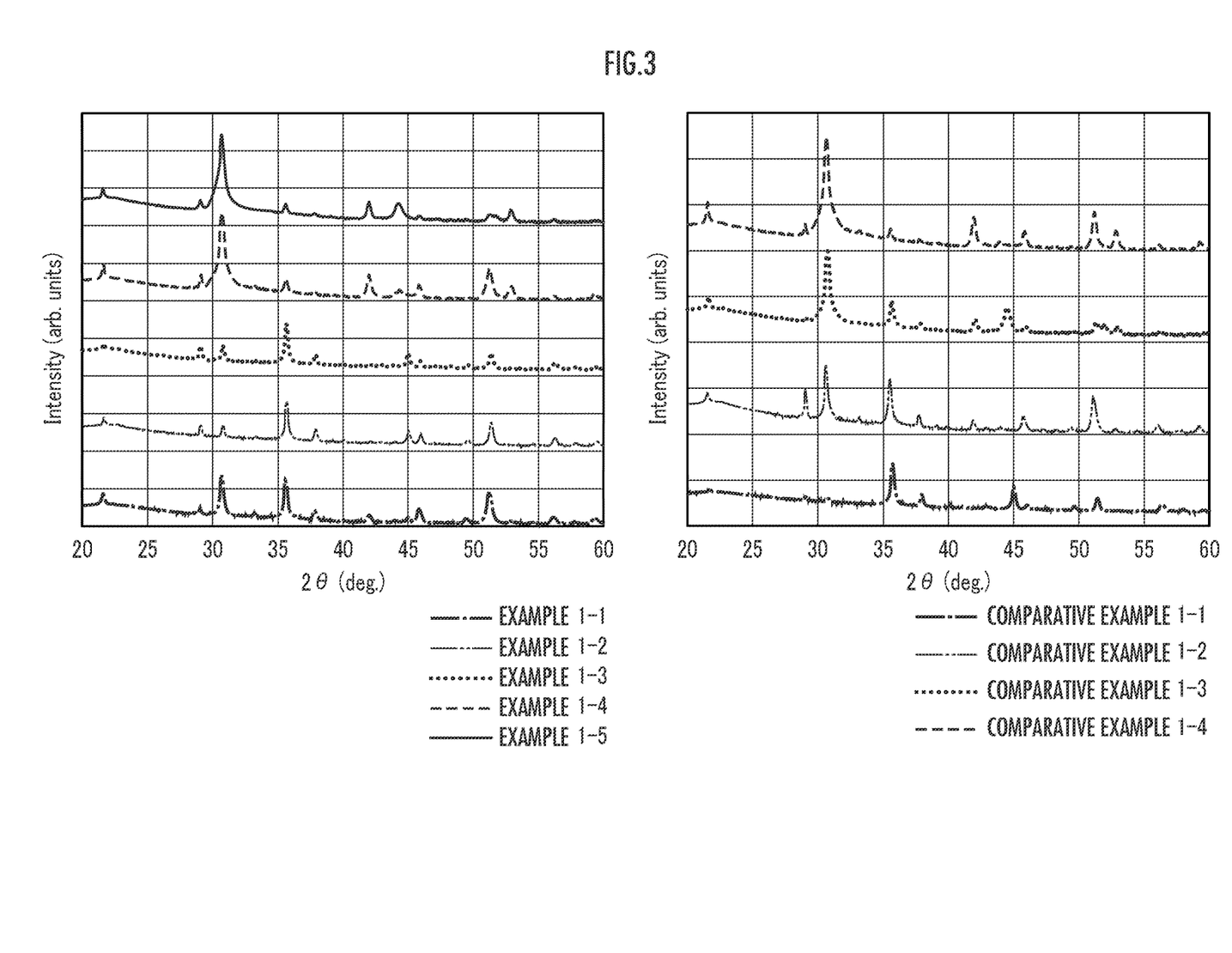
FIG. 3 shows an illustrative view for XRD spectra of Examples and Comparative Examples.

On the left side of FIG. 3, the XRD spectra of the magneto-optical materials 10 of Examples 1-1 to 1-5, in which the matrix 11 is ITO, are indicated by a dashed-dotted line, a dashed-double-dotted line, a dotted line, a dashed line, and a solid line, respectively. On the right side of FIG. 3, the XRD spectra of the magneto-optical materials 10 of Comparative Examples 1-1 to 1-4, in which the matrix 11 is ITO, are indicated by dashed-dotted line, dashed-double-dotted line, dotted line, and dashed line, respectively. It is found from FIG. 3 that diffraction peaks derived from FeCo and Ni, which are nanomagnetic particles, can be confirmed. In addition, it is found from Comparative Example 1-2 and Comparative Example 1-4 that the crystallinity of the matrix ITO deteriorates as the magnetic metal content increases.

(Electrical Resistivity)

Figure 4:
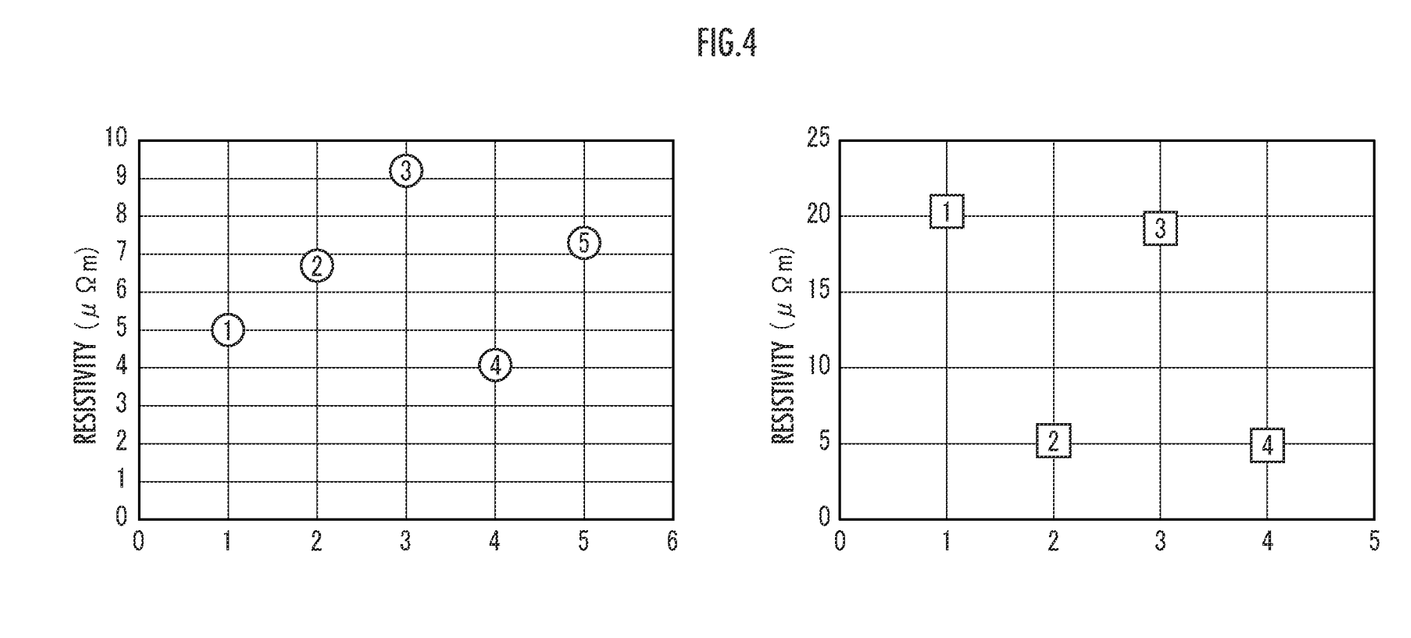
FIG. 4 shows an illustrative view for electrical resistivity of Examples and Comparative Examples.

The left side of FIG. 4 shows the electrical resistivity of each of the magneto-optical materials 10 of Examples 1-1 to 1-5 in which the matrix 11 is ITO. Circled number M on the left side of FIG. 4 corresponds to Example 1-M. The right side of FIG. 4 shows the electrical resistivity of each of the magneto-optical materials 10 of Comparative Examples 1-1 to 1-4 in which the matrix 11 is ITO. The boxed number M on the right side of FIG. 4 corresponds to Comparative Example 1-M. It is found from FIG. 4 that in Examples, a resistivity corresponding to the high electrical conductivity of the ITO matrix is obtained and the carrier density and carrier mobility are high, indicating that there is a wavelength band in the near-infrared region where the dielectric constant is close to zero. On the other hand, an increase in resistivity is confirmed in the samples of Comparative Example 1-1 and Comparative Example 1-3 with a large amount of magnetic metal content. This is considered to be due to a decrease in carrier mobility by a decrease in crystallinity, indicating unsuitability of exhibiting ENZ properties in the near-infrared region.

(Wavelength Dependence of Faraday Rotation Angle)

Figure 5:
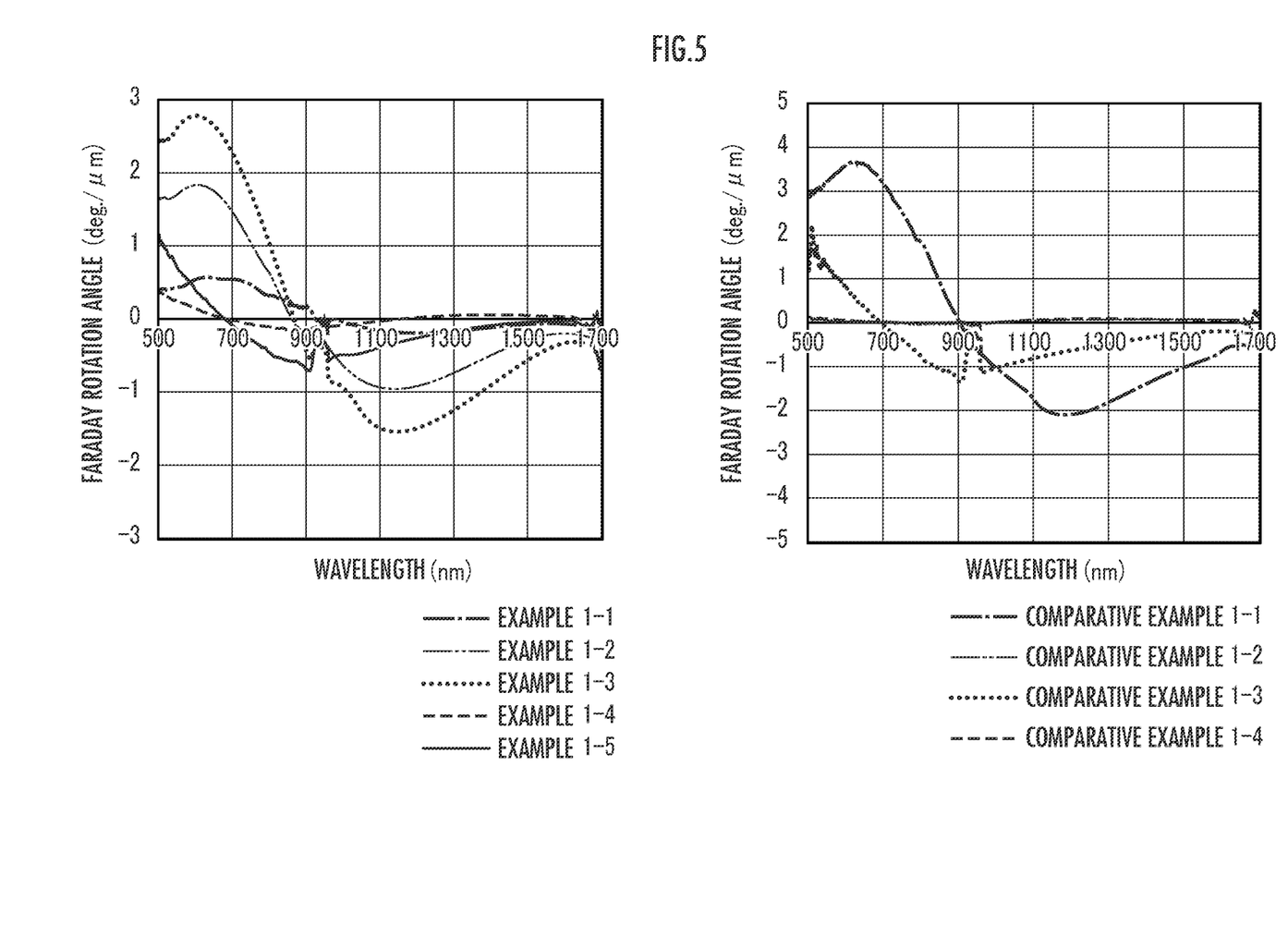
FIG. 5 shows an illustrative view for the wavelength dependence of the Faraday rotation angle in Examples and Comparative Examples.

On the left side of FIG. 5, the measurement results of the wavelength dependence of the Faraday rotation angle $\theta_F$ of the magneto-optical materials 10 of Examples 1-1 to 1-5, in which the matrix 11 is ITO, are indicated by dashed-dotted line, a dashed-double-dotted line, a dotted line, a dashed line, and a solid line, respectively. On the right side of FIG. 5, the measurement results of the wavelength dependence of the Faraday rotation angle $\theta_F$ of the magneto-optical materials 10 of Comparative Examples 1-1 to 1-4, in which the matrix 11 is ITO, are indicated by a dashed-dotted line, a dashed-double-dotted line, and a dotted line, and a dashed line, respectively. It is found from FIG. 5 that the magneto-optical materials 10 of Examples have the maximum values of the Faraday rotation angle $\theta_F$ in the range of 0.3 to 2.8 [deg/μm] in the wavelength range of 500 to 1700 nm, and thus function effectively as magneto-optical materials. It is found that the sign of the Faraday rotation angle $\theta_F$ of each of the magneto-optical materials 10 of Examples 1-1 to 1-3 changes from positive to negative at about 900 nm as the wavelength increases. This is magneto-optical property due to a nanogranular structure in which nanometer-sized magnetic fine particles are dispersed in a matrix, meaning that there is formed a nanogranular structure in which magnetic metals are dispersed in the ITO matrix, and a magneto-optical effect derived from this structure is exhibited. On the other hand, the Faraday effect was not confirmed in Comparative Examples 1-2 and 1-4, indicating that the magnetic metal content was insufficient.

(Magnetization Curve)

Figure 6:
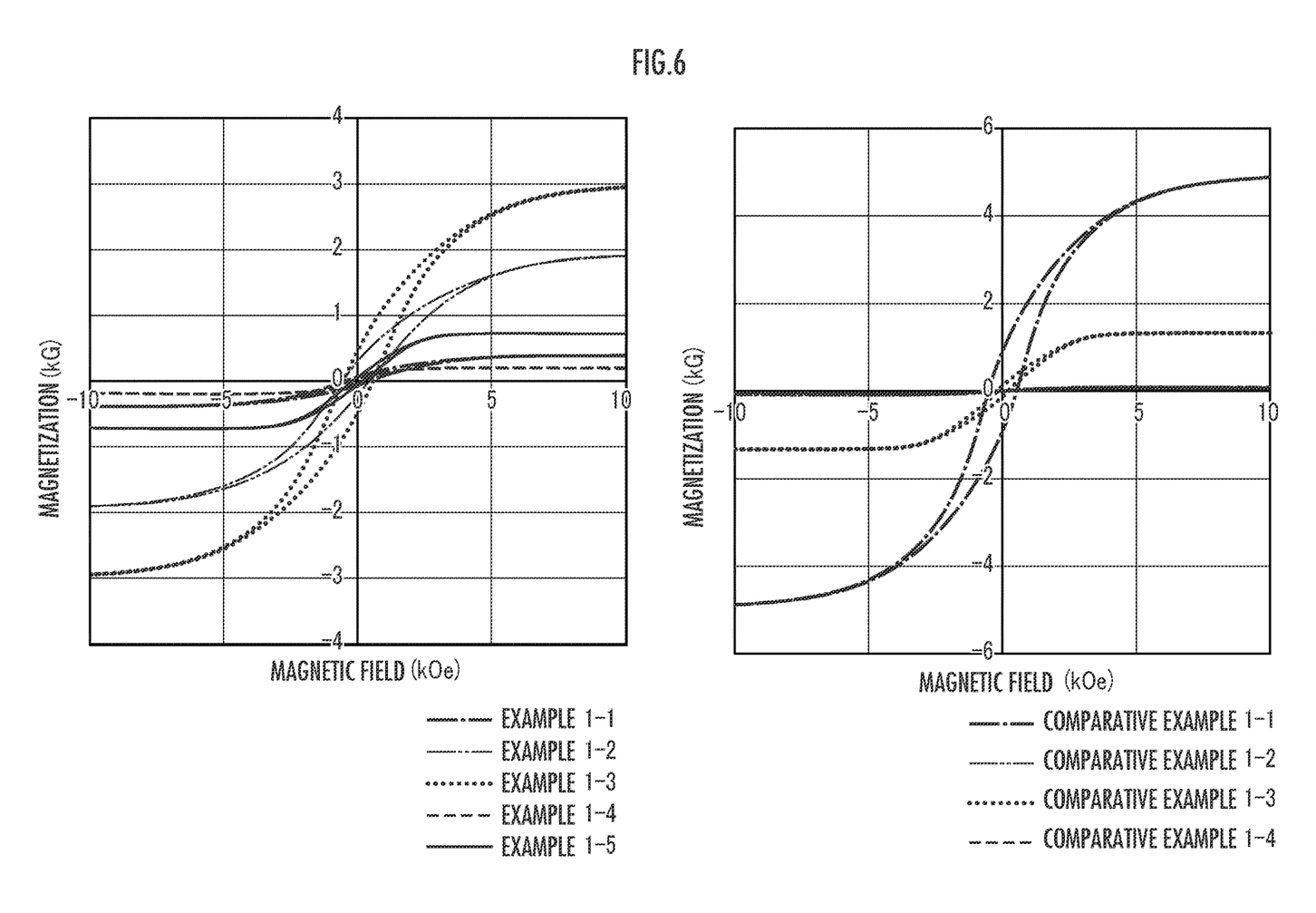
FIG. 6 shows an illustrative view for the magnetization curve of Examples and Comparative Examples.

On the left side of FIG. 6, the magnetization curves of the magneto-optical materials 10 of Examples 1-1 to 1-5, in which the matrix 11 is ITO, are indicated by dashed-dotted line, dashed-double-dotted line, dotted line, dashed line, and solid line, respectively. On the right side of FIG. 6, the magnetization curves of the magneto-optical materials 10 of Comparative Examples 1-1 to 1-4, in which the matrix 11 is ITO, are indicated by dashed-dotted line, dashed-double-dotted line, dotted line, and dashed line, respectively. It is found from FIG. 6 that the saturation magnetic flux density Bs increases as the magnetic metal content increases. Furthermore, it is found that the magnetic properties derived from mainly due to ferromagnetism, and the magnetic properties derived from nano-magnetic particles are obtained. On the other hand, almost no magnetization was confirmed in Comparative Examples 1-2 and 1-4, indicating that the magnetic metal content was insufficient.

(Optical Constant)

Figure 7:
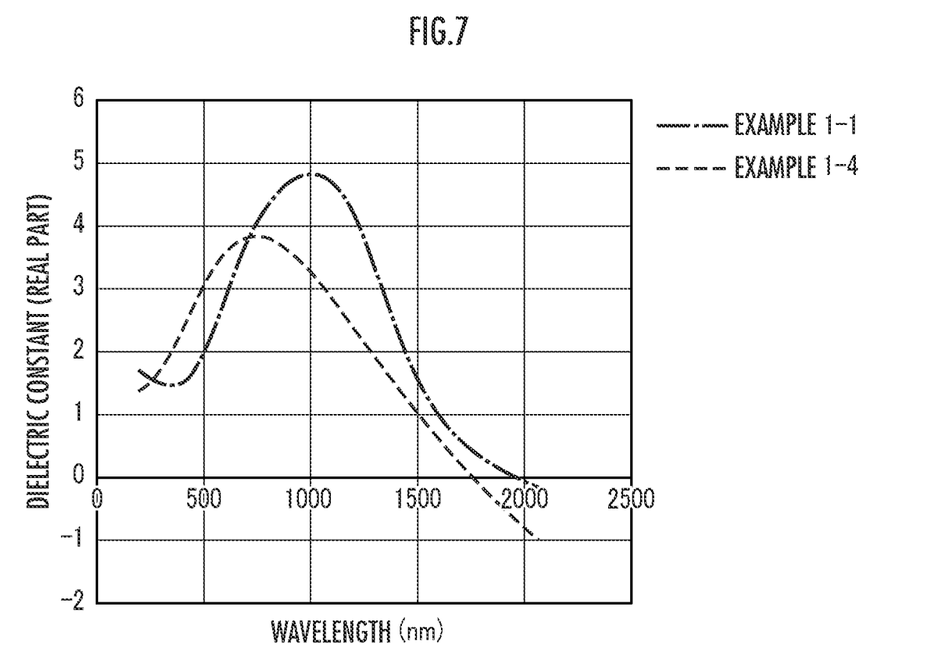
FIG. 7 is an illustrative view for the wavelength dependence of the dielectric constant of Examples.

In FIG. 7, the measurement results of the wavelength dependence of the real part of the dielectric constant of each of Examples 1-1 and 1-4, in which the matrix 11 is ITO, are indicated by a dashed-dotted line and a dashed line, respectively. The complex refractive index m is represented by the relational formula (02) by using the complex dielectric constant $\varepsilon(\omega)$ and the complex magnetic permeability $\mu(\omega)$. Herein, the complex magnetic permeability $\mu(\omega)$ can be treated as 1 because the frequency band is sufficiently high with respect to the ferromagnetic resonance frequency.

$$m=\{\varepsilon(\omega)\cdot\mu(\omega)/(\varepsilon_0\cdot\mu_0)\}^{1/2} \quad (02).$$

It is found from FIG. 7 that at a wavelength $\lambda$ (=c (speed of light)/f) in the range of 200 to 2000 [nm] including visible light and near-infrared light, the refractive index n of the magneto-optical material 10 is in the range of approximately 1.1 to 2.1. It is also found that the refractive index n of the magneto-optical material 10 gradually increases as the wavelength $\lambda$ increases, reaches a maximum value at about 1000 nm, and then gradually decreases.

It is confirmed from FIG. 7 that in this wavelength range, the real part of the dielectric constant of the thin film becomes zero near 1700 nm and 1900 nm, and ENZ properties are obtained in the nanogranular structure in which the magnetic metal is dispersed in the ITO matrix.

(Transmission Properties)

Figure 8:
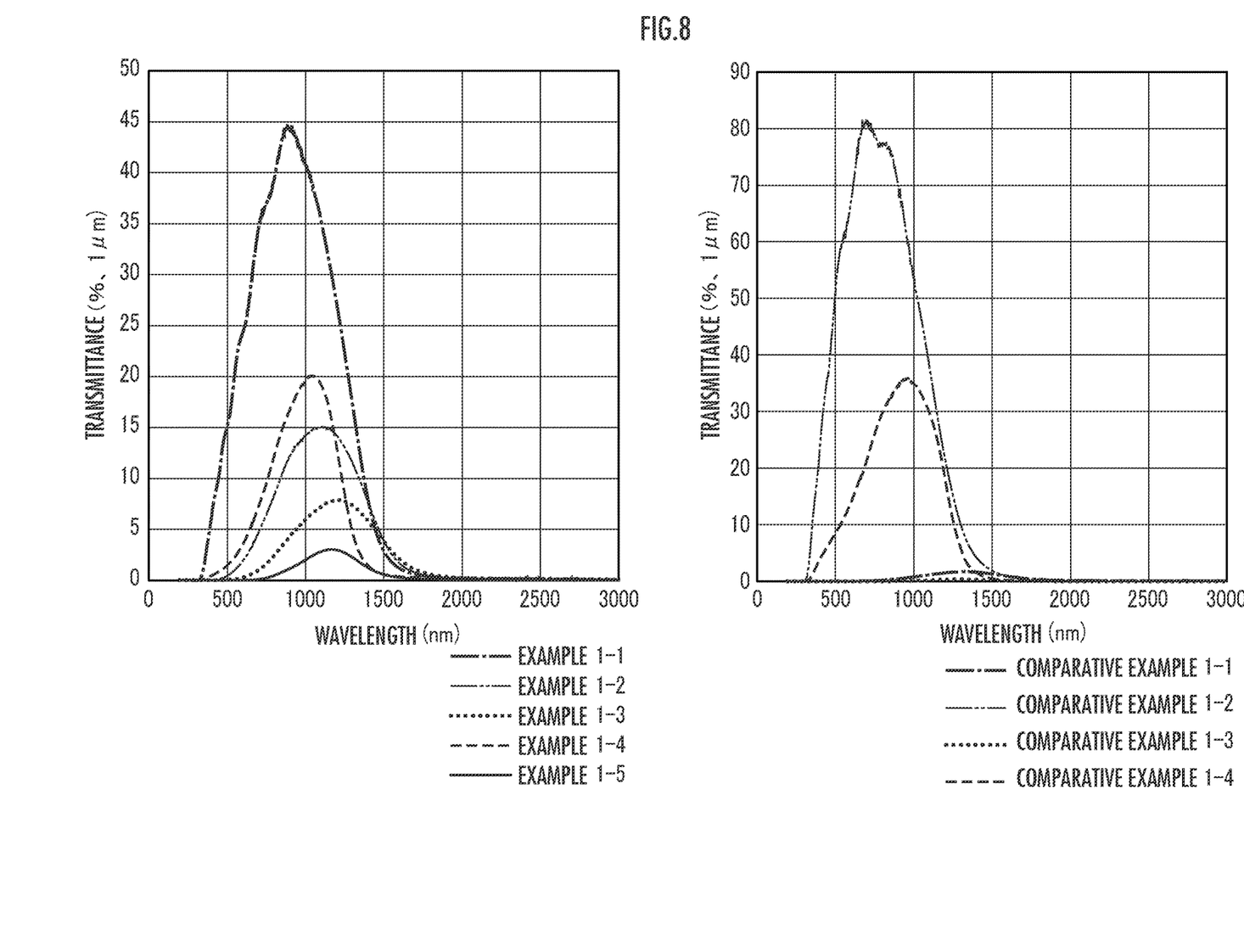
FIG. 8 shows an illustrative view for light transmittance of Examples and Comparative Examples.

On the left side of FIG. 8, the measurement results of the wavelength dependence of the transmittance of the magneto-optical materials 10 of Examples 1-1 to 1-5, in which the matrix 11 is ITO, are indicated by dashed-dotted line, a dashed-double-dotted line, a dotted line, a dashed line, and a solid line, respectively. On the right side of FIG. 8, the measurement results of the wavelength dependence of the transmittance of the magneto-optical materials 10 of Comparative Examples 1-1 to 1-4, in which the matrix 11 is ITO, are indicated by a dashed-dotted line, a dashed-double-dotted line, a dotted line, and a dashed line, respectively.

It is found from FIG. 8 that the transmittance of the magneto-optical material 10 tends to decrease as the metal particle content increases. It is also found that the light transmission properties derived from the ITO matrix having a high light transmission band in the visible light region are exhibited. On the other hand, Examples 1-1, 1-2 and 1-4 are particularly preferable from the viewpoint of suppressing light transmission loss because the transmittance is within the range of 10 to 50%. In contrast, Comparative Examples 1-1 and 1-3 have a light transmittance of 2% or less and are not suitable from the viewpoint of light transmission loss.

(Transmission Properties)

Figure 9:
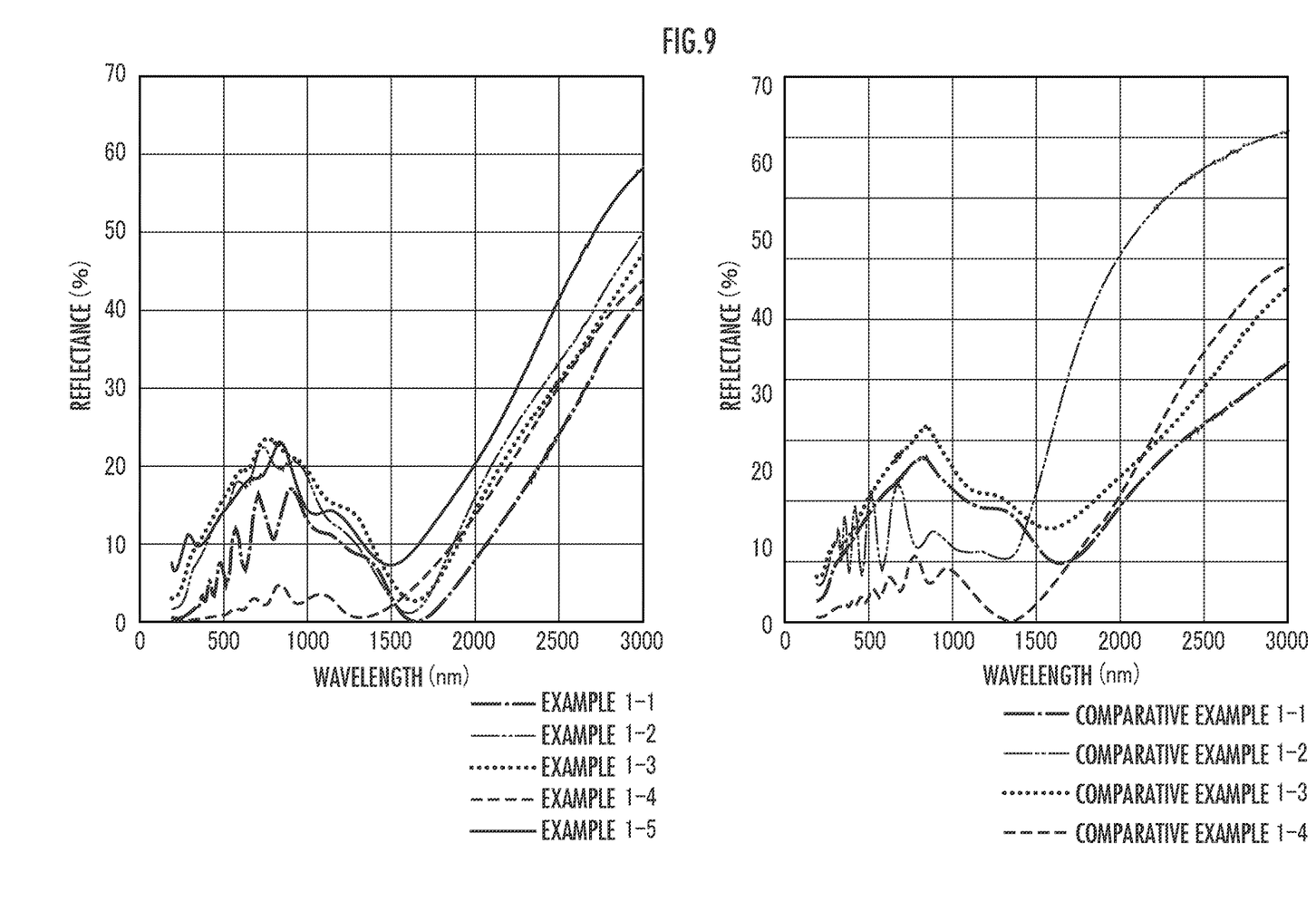
FIG. 9 shows an illustrative view for light reflectance of Examples and Comparative Examples.

On the left side of FIG. 9, the measurement results of the wavelength dependence of the reflectance of the magneto-optical materials 10 of Examples 1-1 to 1-5, in which the matrix 11 is ITO, are indicated by dashed-dotted line, a dashed-double-dotted line, a dotted line, a dashed line, and a solid line, respectively. On the right side of FIG. 9, the measurement results of the wavelength dependence of the reflectance of the magneto-optical materials 10 of Comparative Examples 1-1 to 1-4, in which the matrix 11 is ITO, are indicated by a dashed-dotted line, a dashed-double-dotted line, a dotted line, and a dashed line, respectively.

It is found from FIG. 9 that high reflectance in the infrared region is confirmed, indicating optical properties based on free carrier absorption of the ITO matrix.

REFERENCE SIGNS LIST

10: Magneto-optical material, 11: Matrix, 12: Magnetic metal particles, 20: Substrate, 21: Chip for constituting TCO material, 22: Magnetic metal disk.

The invention claimed is:

1. A magneto-optical material having a nanogranular structure comprising:
   a matrix formed of a transparent conductive oxide (TCO) material exhibiting epsilon near zero (ENZ) properties in an infrared wavelength region; and
   magnetic metal particles dispersed in the matrix,
   wherein
   the matrix is an $In_2O_3$-based compound, and the magnetic metal particles are particles of at least one metal selected from Fe, Co, and Ni or alloys thereof, and
   the magneto-optical material is represented by a composition formula $Fe_aCo_bNi_cIn_xO_yM_z$ with Sn as a M component, where $0 \leq a \leq 0.14$, $0 \leq b \leq 0.13$, $0 \leq c \leq 0.29$, $0.05 \leq a+b+c \leq 0.29$, $0.21 \leq x \leq 0.34$, $0.44 \leq y \leq 0.59$, $0.01 \leq z \leq 0.02$, $0.71 \leq x+y+z \leq 0.95$, and $a+b+c+x+y+z=1$.

2. A sputtering method for producing a magneto-optical material according to claim 1, comprising:
   a first step of not only controlling a temperature of a substrate to a first temperature within a range of 300 to 800 [° C.] but also controlling an atmospheric pressure of the substrate to $1.0 \times 10^{-4}$ [Pa] or less; and
   a second step of applying a composite target or plurality of individual targets of either a TCO material exhibiting ENZ properties in an infrared wavelength region or at least one of an element and a compound that form a basis of the TCO material, together with a material of the magnetic metal particles while not only controlling a temperature of the substrate to a second temperature within a range of 300 to 800 [° C.] but also controlling an atmospheric pressure of the substrate to a range of 0.1 to 10 [Pa] to deposit a magneto-optical material on the substrate.

3. The method for producing a magneto-optical material according to claim 2, wherein the first temperature is higher than the second temperature.

4. A magneto-optical material having a nanogranular structure comprising:
   a matrix formed of a transparent conductive oxide (TCO) material exhibiting epsilon near zero (ENZ) properties in an infrared wavelength region; and
   magnetic metal particles dispersed in the matrix, wherein
   the matrix is an ZnO-based material, and the magnetic metal particles are particles of at least one metal selected from Fe, Co, and Ni or alloys thereof, and
   the magneto-optical material is represented by a composition formula $Fe_aCo_bNi_cZn_xO_yM_z$ with a M component selected from a group consisting of Al and Ga, and composition ratios a, b, c, x, y, and z satisfy, at atomic ratios, $0 \leq a \leq 0.14$, $0 \leq b \leq 0.13$, $0 \leq c \leq 0.29$, $0.05 \leq a+b+c \leq 0.29$, $0.21 \leq x \leq 0.34$, $0.44 \leq y \leq 0.59$, $0.01 \leq z \leq 0.02$, $0.71 \leq x+y+z \leq 0.95$, and $a+b+c+x+y+z=1$.

5. A sputtering method for producing a magneto-optical material according to claim 4, comprising:
   a first step of not only controlling a temperature of a substrate to a first temperature within a range of 300 to 800 [° C.] but also controlling an atmospheric pressure of the substrate to $1.0 \times 10^{-4}$ [Pa] or less; and a second step of applying a composite target or plurality of individual targets of either a TCO material exhibiting ENZ properties in an infrared wavelength region or at least one of an element and a compound that form a basis of the TCO material, together with a material of the magnetic metal particles while not only controlling a temperature of the substrate to a second temperature within a range of 300 to 800 [° C.] but also controlling an atmospheric pressure of the substrate to a range of 0.1 to 10 [Pa] to deposit a magneto-optical material on the substrate.

6. The method for producing a magneto-optical material according to claim 5, wherein the first temperature is higher than the second temperature.

7. A magneto-optical material having a nanogranular structure comprising:
a matrix formed of a transparent conductive oxide (TCO) material exhibiting epsilon near zero (ENZ) properties in an infrared wavelength region; and
magnetic metal particles dispersed in the matrix, wherein the matrix is an CdO-based material, and the magnetic metal particles are particles of at least one metal selected from Fe, Co, and Ni or alloys thereof, and
the magneto-optical material is represented by a composition formula $Fe_aCo_bNi_cCd_xO_yM_z$ with a M component selected from a group consisting of In and Dy, and composition ratios a, b, c, x, y, and z satisfy, at atomic ratios, $0 \leq a \leq 0.14$, $0 \leq b \leq 0.13$, $0 \leq c \leq 0.29$, $0.05 \leq a+b+c \leq 0.29$, $0.21 \leq x \leq 0.34$, $0.44 \leq y \leq 0.59$, $0.01 \leq z \leq 0.02$, $0.71 \leq x+y+z \leq 0.95$, and $a+b+c+x+y+z=1$.

8. A sputtering method for producing a magneto-optical material according to claim 7, comprising:
a first step of not only controlling a temperature of a substrate to a first temperature within a range of 300 to 800 [° C.] but also controlling an atmospheric pressure of the substrate to $1.0 \times 10^{-4}$ [Pa] or less; and
a second step of applying a composite target or plurality of individual targets of either a TCO material exhibiting ENZ properties in an infrared wavelength region or at least one of an element and a compound that form a basis of the TCO material, together with a material of the magnetic metal particles while not only controlling a temperature of the substrate to a second temperature within a range of 300 to 800 [° C.] but also controlling an atmospheric pressure of the substrate to a range of 0.1 to 10 [Pa] to deposit a magneto-optical material on the substrate.

9. The method for producing a magneto-optical material according to claim 8, wherein the first temperature is higher than the second temperature.

10. A magneto-optical material having a nanogranular structure comprising:
a matrix formed of a transparent conductive oxide (TCO) material exhibiting epsilon near zero (ENZ) properties in an infrared wavelength region; and
magnetic metal particles dispersed in the matrix, wherein the matrix is an $SnO_2$-based material, and the magnetic metal particles are particles of at least one metal selected from Fe, Co, and Ni or alloys thereof, and
the magneto-optical material is represented by a composition formula $Fe_aCo_bNi_cSn_xO_yM_z$ with a M component selected from a group consisting of F and Nb, and composition ratios a, b, c, x, y, and z satisfy, at atomic ratios, $0 \leq a \leq 0.14$, $0 \leq b \leq 0.13$, $0 \leq c \leq 0.29$, $0.05 \leq a+b+c \leq 0.29$, $0.21 \leq x \leq 0.34$, $0.44 \leq y \leq 0.700.59$, $0.01 \leq z \leq 0.02$, $0.71 \leq x+y+z \leq 0.95$, and $a+b+c+x+y+z=1$.

11. A sputtering method for producing a magneto-optical material according to claim 10, comprising:
a first step of not only controlling a temperature of a substrate to a first temperature within a range of 300 to 800 [° C.] but also controlling an atmospheric pressure of the substrate to $1.0 \times 10^{-4}$ [Pa] or less; and
a second step of applying a composite target or plurality of individual targets of either a TCO material exhibiting ENZ properties in an infrared wavelength region or at least one of an element and a compound that form a basis of the TCO material, together with a material of the magnetic metal particles while not only controlling a temperature of the substrate to a second temperature within a range of 300 to 800 [° C.] but also controlling an atmospheric pressure of the substrate to a range of 0.1 to 10 [Pa] to deposit a magneto-optical material on the substrate.

12. The method for producing a magneto-optical material according to claim 11, wherein the first temperature is higher than the second temperature.

13. A magneto-optical material having a nanogranular structure comprising:
a matrix formed of a transparent conductive oxide (TCO) material exhibiting epsilon near zero (ENZ) properties in an infrared wavelength region; and
magnetic metal particles dispersed in the matrix, wherein the matrix is an $TiO_2$-based material, and the magnetic metal particles are particles of at least one metal selected from Fe, Co, and Ni or alloys thereof, and
the magneto-optical material is represented by a composition formula $Fe_aCo_bNi_cTi_xO_yNb_z$, and composition ratios a, b, c, x, y, and z satisfy, at atomic ratios, $0 \leq a \leq 0.14$, $0 \leq b \leq 0.13$, $0 \leq c \leq 0.29$, $0.05 \leq a+b+c \leq 0.29$, $0.21 \leq x \leq 0.34$, $0.44 \leq y \leq 0.59$, $0.01 \leq z \leq 0.02$, $0.71 \leq x+y+z \leq 0.95$, and $a+b+c+x+y+z=1$.

14. A sputtering method for producing a magneto-optical material according to claim 13, comprising:
a first step of not only controlling a temperature of a substrate to a first temperature within a range of 300 to 800 [° C.] but also controlling an atmospheric pressure of the substrate to $1.0 \times 10^{-4}$ [Pa] or less; and
a second step of applying a composite target or plurality of individual targets of either a TCO material exhibiting ENZ properties in an infrared wavelength region or at least one of an element and a compound that form a basis of the TCO material, together with a material of the magnetic metal particles while not only controlling a temperature of the substrate to a second temperature within a range of 300 to 800 [° C.] but also controlling an atmospheric pressure of the substrate to a range of 0.1 to 10 [Pa] to deposit a magneto-optical material on the substrate.

15. The method for producing a magneto-optical material according to claim 14, wherein the first temperature is higher than the second temperature.

16. A magneto-optical material having a nanogranular structure comprising:
a matrix formed of a transparent conductive oxide (TCO) material exhibiting epsilon near zero (ENZ) properties in an infrared wavelength region; and
magnetic metal particles dispersed in the matrix, wherein the matrix is an $In_2O_3$—ZnO-based material, and the magnetic metal particles are particles of at least one metal selected from Fe, Co, and Ni or alloys thereof, and
the magneto-optical material is represented by a composition formula $Fe_aCo_bNi_cIn_xGa_yZn_zO_w$, and composition ratios a, b, c, x, y, z, and w satisfy, at atomic ratios, $0 \leq a \leq 0.14$, $0 \leq b \leq 0.13$, $0 \leq c \leq 0.29$, $0.05 \leq a+b+c \leq 0.29$, $0.21 \leq x \leq 0.34$, $0.44 \leq y \leq 0.59$, $0.01 \leq z \leq 0.02$, $0.71 \leq x+y+z \leq 0.95$, and $a+b+c+x+y+z=1$.

17. A sputtering method for producing a magneto-optical material according to claim 16, comprising:
a first step of not only controlling a temperature of a substrate to a first temperature within a range of 300 to 800 [° C.] but also controlling an atmospheric pressure of the substrate to $1.0 \times 10^{-4}$ [Pa] or less; and
a second step of applying a composite target or plurality of individual targets of either a TCO material exhibiting ENZ properties in an infrared wavelength region or at least one of an element and a compound that form a basis of the TCO material, together with a material of the magnetic metal particles while not only controlling a temperature of the substrate to a second temperature within a range of 300 to 800 [° C.] but also controlling an atmospheric pressure of the substrate to a range of 0.1 to 10 [Pa] to deposit a magneto-optical material on the substrate.

18. The method for producing a magneto-optical material according to claim 17, wherein the first temperature is higher than the second temperature.

\* \* \* \* \*